(12) United States Patent
Milkov et al.

(10) Patent No.: US 10,205,463 B1
(45) Date of Patent: Feb. 12, 2019

(54) DUAL-GAIN SINGLE-SLOPE ADC WITH DIGITAL CDS

(71) Applicant: Teledyne Scientific & Imaging, LLC, Thousand Oaks, CA (US)

(72) Inventors: Mihail Milkov, Moorpark, CA (US); Kyle LaFevre, Ventura, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 16/039,116

(22) Filed: Jul. 18, 2018

(51) Int. Cl.
| | |
|---|---|
| *H03M 1/06* | (2006.01) |
| *H03M 1/08* | (2006.01) |
| *H03M 1/56* | (2006.01) |

(52) U.S. Cl.
CPC .......... *H03M 1/56* (2013.01); *H03M 1/0675* (2013.01); *H03M 1/0836* (2013.01); *H03M 1/0854* (2013.01)

(58) Field of Classification Search
CPC .... H03M 1/56; H03M 1/0675; H03M 1/0854; H03M 1/0836
USPC ................................................. 341/155, 169
See application file for complete search history.

(56) References Cited

U.S. PATENT DOCUMENTS

| | | | | |
|---|---|---|---|---|
| 7,471,231 | B2 | 12/2008 | Ang et al. | |
| 9,473,125 | B2 * | 10/2016 | Yoo | .......................... H03K 5/24 |
| 9,578,268 | B2 * | 2/2017 | Kim | ....................... H04N 5/378 |
| 9,774,318 | B2 * | 9/2017 | Song | ....................... H03K 4/48 |
| 9,912,883 | B1 * | 3/2018 | Lee | ......................... H04N 5/378 |

OTHER PUBLICATIONS

Lindgren, Leif "A New Simultaneous Multislope ADS Architecture for Array Implementations" IEEE Transactions on Circuits and Systems, vol. 53, No. 9, Sep. 2006, 5 pages.

(Continued)

*Primary Examiner* — Khai M Nguyen
(74) *Attorney, Agent, or Firm* — M.J. Ram and Associates

(57) ABSTRACT

A column-parallel dual-gain single-slope ADC comprises an input for receiving a signal $V_{in}$, a sample-and-hold stage which receives $V_{in}$ and outputs sampled signal $V_{in,samp}$, a comparator, a counter, and a ramp generator which generates high-gain (HG) and low-gain (LG) ramps, with the ratio of the LG ramp slope to the HG ramp slope being greater than 1. During a coarse conversion phase, $V_{in,samp}$ is compared with a threshold voltage $V_{thresh}$, and a flag is set to a first or second state depending on the comparison. During a fine conversion phase, if the flag is in the first state, the HG ramp is provided to the comparator and its output toggles when the ramp voltage becomes equal to $V_{in,samp}$. If the flag is in the second state, the LG ramp is provided to the comparator and its output toggles when the LG ramp voltage becomes equal to $V_{in,samp}$.

33 Claims, 5 Drawing Sheets

(56) References Cited

OTHER PUBLICATIONS

Bergey, J, et al (Forza Silicon), "Real-time Calibration of a 14-Bit Single Slope ADC With 290MHz On-chip Accelerated Ramp Generator for Column-Parallel Image Sensors", 2013 IISW, 4 pages.
Martijn F. Snoeij, Albert Theuwissen, Kofi Makinwa, Johan Huijsung, "Multiple-Ramp Column-Parallel ADC Architectures for CMOS Image Sensors" IEEE Journal of Solid-State Circuits, vol. 42, No. 12, Dec. 2007, 10 pages.
Zhang, D. et al (Forza Silicon) "Single Slope ADC With On-Chip Accelerated Continuous-time Differential Ramp Generator for Low Noise Column-Parallel CMOS Image Sensor", 4 pages.

\* cited by examiner

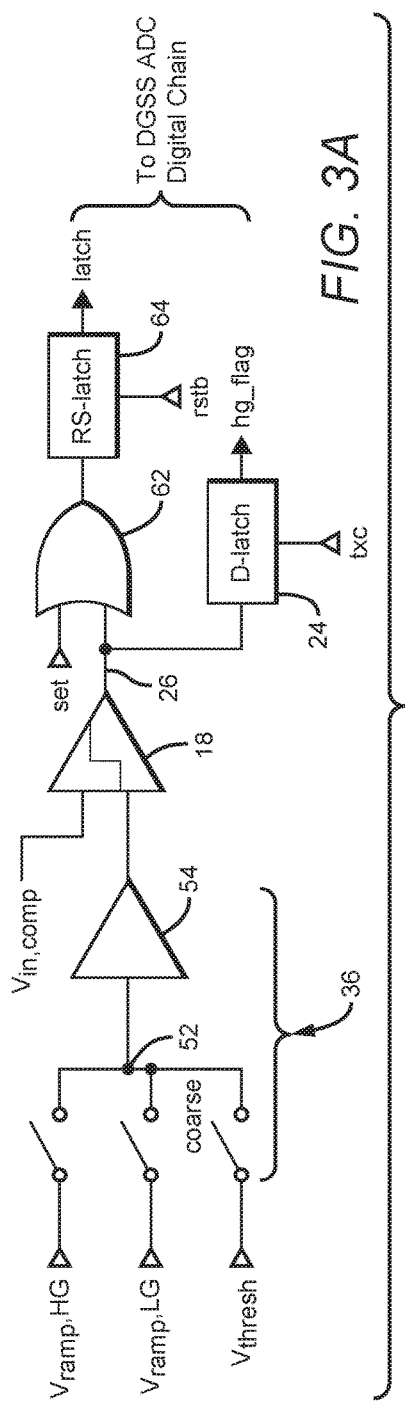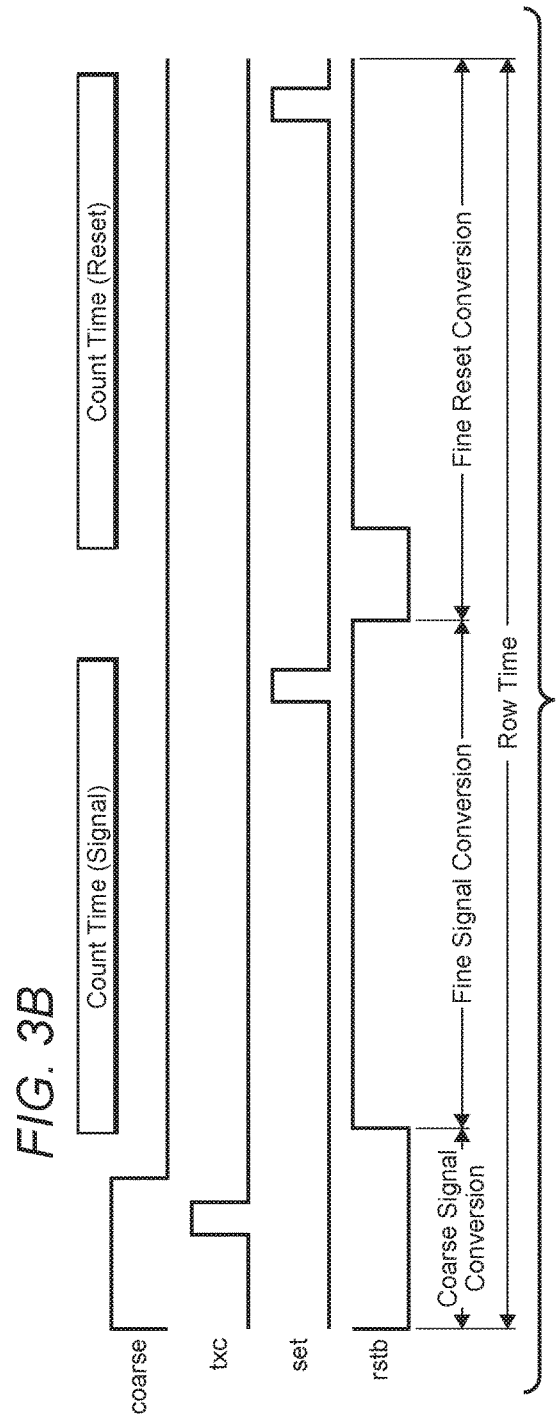
FIG. 3A
FIG. 3B

DUAL-GAIN SINGLE-SLOPE ADC WITH DIGITAL CDS

BACKGROUND OF THE INVENTION

Field of the Invention

This invention relates generally to analog-to-digital converters (ADCs), and more particularly to column-parallel single-slope ADCs for image sensors.

Description of the Related Art

One type of ADC commonly used with image sensors is a column-parallel single-slope ADC. This type of ADC offers certain inherent advantages: simple design, small layout area, no capacitor matching requirement, inherent monotonicity, and no column-to-column gain variation (if using a shared voltage ramp).

However, conventional column-parallel single-slope ADCs have one significant limitation: the conversion time increases with $2^n$, where n is the ADC resolution. It is therefore difficult to achieve high conversion speed and high resolution simultaneously. At the same time, high ADC resolution for image sensors is only needed when the integrated photocurrent is small; for large integrated photocurrent the photon shot noise dominates all other noise sources, including the ADC quantization noise. Therefore, an ADC particularly well suited to image sensors would maintain a small quantization step (i.e. have high resolution) only when the pixel signal level is close to the dark level and would increase its quantization step as the pixel signal level increases. One such advantageous solution is the dual-gain single-slope (DGSS) ADC.

SUMMARY OF THE INVENTION

A column-parallel dual-gain single-slope (DGSS) ADC is presented which provides fast conversion time and high resolution while still maintaining the benefits of a single-slope ADC.

The present ADC comprises an input node for receiving an input signal $V_{in}$, a sample-and-hold (S/H) stage arranged to sample $V_{in}$ and provide sampled signal $V_{in,samp}$ at an output, and a comparator. The ADC further comprises a counter which steps through a predefined range of count values in a count time, and a global ramp generator which generates a high-gain (HG) ramp and a low-gain (LG) ramp which ramp up or down simultaneously, with the ratio G of the LG ramp slope to the HG ramp slope being greater than 1.

In operation, the ADC is arranged such that:
- during a sampling phase, input signal $V_{in}$ is sampled by the S/H stage and the sampled voltage $V_{in,samp}$ is provided to the comparator's first input;
- during a coarse conversion phase, $V_{in,samp}$ is compared with a threshold voltage $V_{thresh}$ and a flag hg_flag is set either high or low depending on the comparison;
- during a fine conversion phase which follows the coarse conversion phase and includes the count time:
  - if hg_flag is set high, the HG ramp is provided to the comparator's second input and the comparator output toggles when the HG ramp voltage becomes equal to $V_{in,samp}$, and
  - if the hg_flag is set low, the LG ramp is provided to the comparator's second input and the comparator output toggles when the LG ramp voltage becomes equal to $V_{in,samp}$.

In one embodiment, the ADC performs two conversions per row time and is further arranged such that it digitizes a signal level $V_{sig}$ (signal conversion) and then a reset level $V_{rst}$ (reset conversion) in this order within the row time. This ADC functionality allows for digital subtraction of the reset level from the signal level and can be used to accomplish digital correlated double sampling (CDS).

These and other features, aspects, and advantages of the present invention will become better understood with reference to the following drawings, description, and claims.

BRIEF DESCRIPTION OF THE DRAWINGS

FIG. 3A is a schematic diagram of a possible implementation of several of the circuit blocks shown in FIG. 2.

FIG. 3B is a timing diagram illustrating the operation of the circuitry shown in FIG. 3A.

DETAILED DESCRIPTION OF THE INVENTION

Figure 1A:
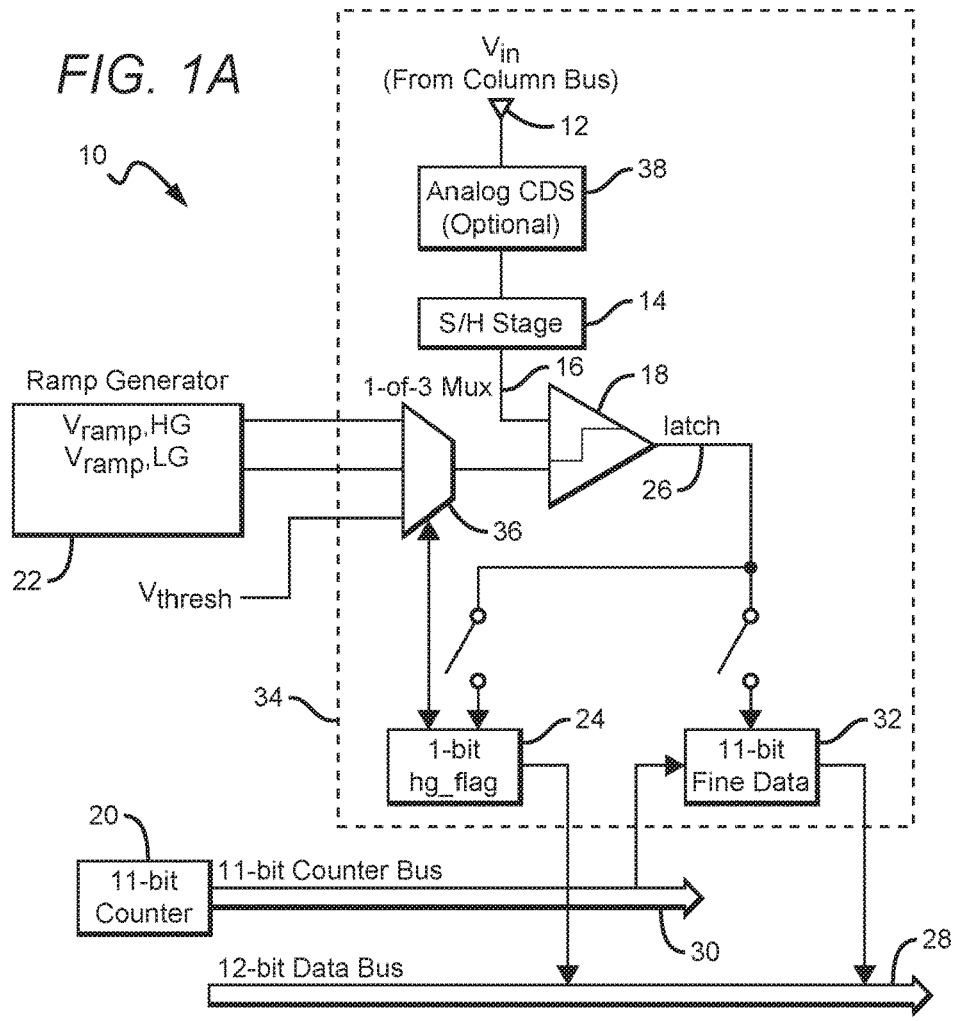
FIG. 1A is a block diagram of one possible embodiment of a DGSS ADC in accordance with the present invention.

One possible embodiment of a dual-gain single-slope analog-to-digital converter (DGSS ADC)—suitably a column parallel DGSS ADC—in accordance with the present invention is shown in FIG. 1A.

The ADC 10 has an input node 12 for receiving an input signal $V_{in}$ having an associated maximum input swing $\Delta V_{in,max}$, which would typically originate from a column bus of a pixel array. The input signal $V_{in}$ at input node 12 is optionally passed through an analog CDS stage 38, which drives a sample-and-hold (S/H) stage 14. Alternatively, the input node 12 is coupled directly to the S/H stage 14. The S/H stage 14 is arranged to provide sampled signal $V_{in,samp}$ at an S/H output 16, which is connected to the first input of comparator 18. The second input of comparator 18 is connected to the output of multiplexer 36, which selects one of three voltages: a DC threshold voltage $V_{thresh}$, a high-gain (HG) ramp $V_{ramp,HG}$, and a low-gain (LG) ramp $V_{ramp,LG}$. The HG and LG ramp voltages are generated by a global ramp generator 22. The ADC also includes a 1-bit digital storage called hg_flag 24 and an 11-bit digital storage called fine data 32. The ADC also includes an 11-bit counter 20 which steps through a predefined range of count values (for example, from 0 to 2047) in a "count time". In this ADC embodiment, all aforementioned circuit blocks with the exception of the ramp generator 22 and counter 20, are located in an ADC column 34. The counter 20 is preferably global: its output forms an 11-bit counter bus, which is shared among multiple ADC columns 34. Similarly, the ramp generator 22 is preferably global: the HG and LG voltage ramps are shared among multiple ADC columns 34.

The stored values of the 1-bit hg_flag 24 and the 11-bit fine data 32 form the ADC output and are read out on a 12-bit data bus 28.

Figure 1B:
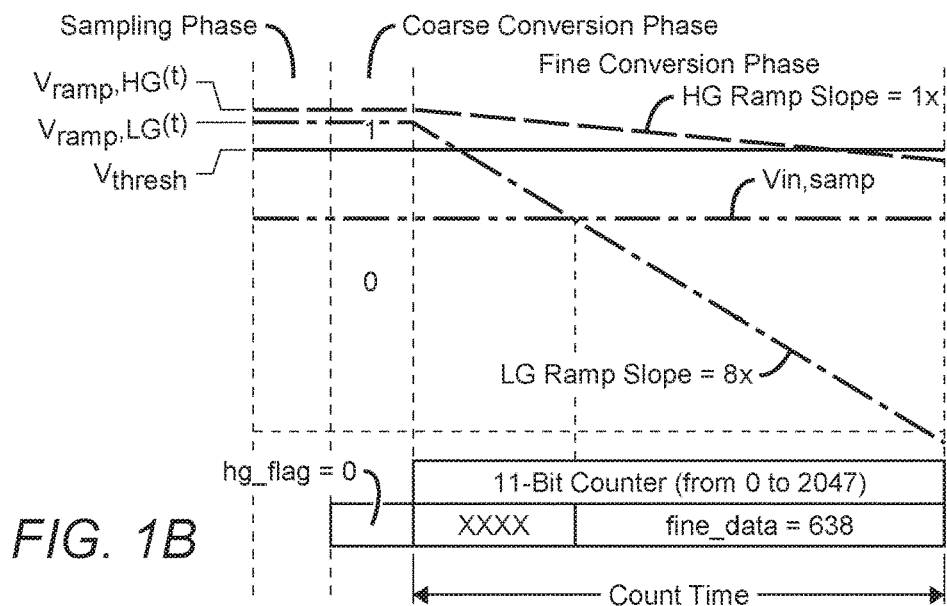
FIG. 1B is a timing diagram illustrating the principle of operation of the ADC shown in FIG. 1A.

The principle of operation of the DGSS ADC is better understood with the help of FIG. 1B. The ADC operation consists of three phases: sampling phase, coarse conversion phase and fine conversion phase. For simplicity, in this example the sampling phase precedes the other two phases although this is not necessary; in order to increase the ADC conversion rate, the sampling phase may be concurrent with the coarse and fine conversion phases as will be shown later. The HG and LG ramp signals have substantially the same start voltage and ramp up or (in this case) down simultaneously during the count time. The ratio G of the LG ramp slope to the HG ramp slope must be greater than one; G=8 in the example shown, and is preferably a power of 2. The swing of the LG ramp during the count time is $\Delta V_{ramp,LG}$, with $\Delta V_{ramp,LG}$ required to be greater than or equal to the input swing $\Delta V_{in,max}$. The swing of the HG ramp during the count time is $\Delta V_{ramp,HG}$, which is given by: $\Delta V_{ramp,LG}/G$.

ADC 10 is arranged such that:

During the sampling phase, input signal $V_{in}$ is sampled by S/H stage 14 and the sampled voltage $V_{in,samp}$ is provided to the first input of comparator 18.

During the coarse conversion phase, multiplexer 36 is configured such that DC threshold voltage $V_{thresh}$ is routed to the second input of comparator 18 such that $V_{in,samp}$ is compared with $V_{thresh}$. For descending HG and LG ramps (as in this example), $V_{thresh}$ is positioned to be slightly higher than the value of the LG ramp at the end of the count time. The comparator output signal 26 (called latch) during the coarse phase establishes the state of hg_flag: hg_flag=1 if $V_{in,samp} > V_{thresh}$ and hg_flag=0 otherwise. In the example of FIG. 1B, $V_{in,samp} < V_{thresh}$ and hg_flag is set to 0 during the coarse conversion phase.

During the fine conversion phase, which follows the coarse conversion phase and includes the count time:

multiplexer 36 routes either the HG ramp or the LG ramp to the second input of comparator 18 depending on hg_flag:
- if hg_flag=1, $V_{ramp,HG}$ is provided to the second input of comparator 18 and the comparator output 26 toggles when the HG ramp voltage becomes equal to $V_{in,samp}$, and
- if hg_flag=0, $V_{ramp,LG}$ is provided to the second input of comparator 18 and comparator output 26 toggles when the LG ramp voltage becomes equal to $V_{in,samp}$.

When the latch signal toggles, the current counter value is latched and stored as the fine data. In the example of FIG. 1B, hg_flag=0 and hence during the fine conversion phase, $V_{in,samp}$ is compared against $V_{ramp,LG}$. When $V_{ramp,LG} = V_{in,samp}$, the comparator toggles and the counter value (638 in this example) is latched and stored as the fine data.

The ADC quantization step is obtained by dividing the ramp swing during the count time by the number of counter steps. The ramp swing, and hence the quantization step, is different depending on whether the HG or LG ramp is selected. Assuming the counter is an n-bit counter, the ADC quantization step is $\Delta V_{ramp,LG}/2^n$ and the ADC resolution is n when the hg_flag=0, and the ADC quantization step is $\Delta V_{ramp,LG}/(G \cdot 2^n)$ and the ADC resolution is $n + \log_2 G$ when hg_flag=1. As an example, the ADC embodiment shown in FIG. 1B has an 11-bit counter and ramp slope ratio G=8. Thus the ADC quantization step is $\Delta V_{ramp,LG}/2048$ and the ADC resolution is 11 bits when hg_flag=0, and the ADC quantization step is $\Delta V_{ramp,LG}/16384$ and the ADC resolution is 14 bits when hg_flag=1.

As seen, the DGSS ADC has a variable quantization step. Accordingly, the ADC quantization noise is $$\frac{1}{\sqrt{12}}$$

counts when the HG ramp is used and $$\frac{G}{\sqrt{12}}$$

counts when the LG ramp is used. This property makes the DGSS ADC particularly well suited to image sensors converting a pixel output signal that represents the integrated photocurrent on a capacitor. It is desirable that the pixel dark level (the pixel output when there is no integrated photocurrent) falls within the swing of the HG ramp. Thus in low illumination conditions (when the pixel output is close to the dark level), the ADC uses the HG ramp and the quantization step is small. For higher illumination the integrated photocurrent increases and so does the resulting photon shot noise. If the photon shot noise is the dominant noise source, then the ADC quantization step can be relaxed. Assuming that the pixel full well capacity in electrons is $N_{max}$ and the LG ramp swing spans the full well capacity, it can be shown that the shot noise (expressed in ADC counts) at the end of the HG ramp swing is $$\frac{2^n}{\sqrt{\frac{N_{max}}{G}}}.$$

The ADC counter resolution n and ramp slope ratio G should be chosen such that the ADC quantization noise when switching to the LG ramp is much less than the shot noise:

$$\frac{G}{\sqrt{12}} \ll \frac{2^n}{\sqrt{\frac{N_{max}}{G}}}.$$

The ADC implementation of FIG. 1B has descending HG and LG ramps and is compatible with a pixel output signal that decreases with illumination. In the case when the pixel output signal increases with illumination, the DGSS ADC preferably uses ascending HG and LG ramps. Below is a more precise definition (which is equally applicable to ascending and descending ramps) of the HG and LG ramp swings, the position of the threshold voltage $V_{thresh}$ and the condition for establishing the value of hg_flag. The input signal $V_{in}$ to the DGSS ADC varies between a constant reset level $V_{rst}$ and a signal level $V_{sig} = V_{rst} - \Delta V_{sig}$, where $\Delta V_{sig}$ is signal amplitude, which is either positive or negative depending on the application. During the count time, the LG ramp swings from a voltage $V_{ramp,LG,start}$ to a voltage $V_{ramp,LG,end} = V_{ramp,LG,start} - \Delta V_{ramp,LG}$, where $\Delta V_{ramp,LG}$ has the same polarity as $\Delta V_{sig}$, and $V_{rst}$ and $V_{sig}$ are between $V_{ramp,LG,start}$ and $V_{ramp,LG,end}$. Similarly, during the count time, the HG ramp swings from a voltage $V_{ramp,HG,start}$ to a voltage $V_{ramp,HG,end} = V_{ramp,HG,start} - \Delta V_{ramp,HG}$, where $\Delta V_{ramp,HG}$ has the same polarity as $\Delta V_{sig}$, and $V_{rst}$ is between $V_{ramp,HG,start}$ and $V_{ramp,HG,end}$.

The threshold voltage $V_{thresh}$ is preferably given by $V_{ramp,HG,end} + \Delta V$, where $\Delta V$ has the same polarity as $\Delta V_{sig}$ and $0 < |\Delta V| < |\Delta V_{ramp,HG}|$. If $\Delta V_{sig} > 0$, hg_flag=1 if $V_{in,samp} > V_{thresh}$, and hg_flag=0 if $V_{in,samp} \leq V_{thresh}$. If $\Delta V_{sig} < 0$, hg_flag=1 if $V_{in,samp} < V_{thresh}$, and hg_flag=0 if $V_{in,samp} \geq V_{thresh}$.

If $V_{sig} < V_{rst}$, the HG and LG ramps are arranged to be descending (as shown in FIG. 1B), and if $V_{sig} > V_{rst}$, the HG and LG ramps are arranged to be ascending.

In CMOS image sensors targeting low read noise it is desirable to cancel the kTC reset noise stored on the pixel integrating capacitor. This is accomplished by performing correlated double sampling (CDS), i.e. reading the reset level (the pixel output without integrated photocurrent) and the signal level (the pixel output with integrated photocurrent) sequentially within the same row time and subtracting the reset level from the signal level. This subtraction is often performed in the column circuitry outside of the pixel array. The CDS subtraction can be carried out by an analog CDS stage 38 as shown in FIG. 1A. Alternatively, the CDS subtraction can be performed digitally if the ADC digitizes both the the signal and reset levels. Compared to analog CDS, digital CDS not only cancels the pixel kTC reset noise and reset level variation but also removes all offsets and suppresses 1/f noise in the entire analog chain. As a result, fixed-pattern noise (FPN) and gradients in the image are greatly reduced.

The DGSS ADC supports three CDS methods:
1) Analog CDS, wherein the ADC performs one conversion per row time digitizing the signal level of the CDS stage, which is the difference between the pixel reset level and the pixel signal level;
2) Digital CDS, wherein the ADC performs two conversions per row time digitizing consecutively first the pixel signal level and then the pixel reset level;
3) Analog+digital CDS, in which case the ADC performs two conversions per row time digitizing consecutively first the signal level of the analog CDS stage (the difference between the pixel reset level and the pixel signal level) and then the reset level of the analog CDS stage.

Sometimes the random variation of the pixel reset level from pixel to pixel is large enough that it takes a sizeable portion of the HG ramp swing, thereby limiting the pixel voltage range in which the ADC maintains the fine quantization step. This is a shortcoming of method 2, which is overcome by using method 3, for which the variation of the pixel reset level is absorbed by the analog CDS stage. While methods 2 and 3 both cancel the offsets and reduce the 1/f noise of the entire analog chain, method 3 also cancels the kTC reset noise of the CDS stage. For methods 2 and 3 it is preferable that the same voltage ramp (either HG or LG) is used in the fine conversion phase of both signal and reset conversions so that the effects of the comparator offset and delay are canceled after digital CDS. Thus, the coarse phase of the first conversion defines the value of hg_flag which is used during the fine phase of both conversions; the second conversion in fact need not have a coarse phase. Also the signal level must be digitized first in order to determine which ramp (HG or LG) to use. However, depending on the pixel architecture, the signal level may or may not be the first one to be read out of the pixel within the row time. In fact, for visible pixels using a pinned photodiode and a transfer gate the reset level is read out before the signal level. In this case the DGSS ADC must have a means to reorder the samples such that the signal level is digitized first even though it is read out after the reset level.

Figure 2:
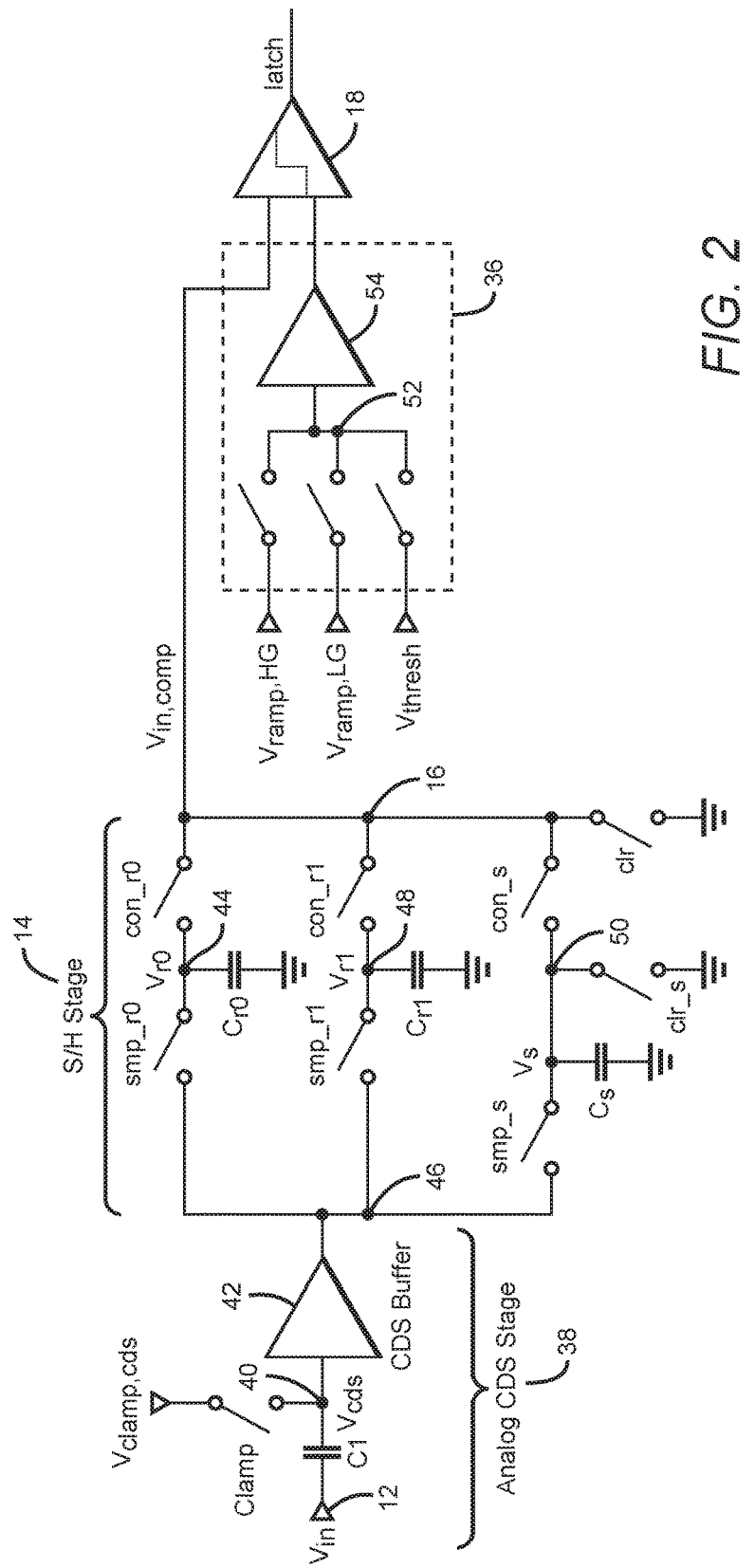
FIG. 2 is a schematic diagram of a possible implementation of a DGSS ADC with analog and digital CDS.

FIG. 2 shows a preferred embodiment of a DGSS ADC that supports analog+digital CDS (method 3) and also combines the following useful features: 1) sampling and conversion occur simultaneously; and 2) the ADC reorders the input samples, i.e. it converts the signal level first even though the pixel reset level is provided to the ADC before the pixel signal level. The DGSS ADC of FIG. 2 consists of the same main building blocks as outlined in FIG. 1A: analog CDS stage 38, S/H stage 14, multiplexer 36 and comparator 18. The structure and operation of these building blocks will be described next.

The analog CDS stage 38 comprises a capacitor C1 connected in series between input node 12 and a node 40. A clamp switch, which is operated with a control signal clamp, is connected between node 40 and a fixed CDS clamp voltage $V_{clamp,cds}$. It should be noted that the kTC reset noise sampled on capacitor C1 when the clamp switch is opened is canceled by the digital CDS operation. Therefore, capacitor C1 can be small. A CDS buffer circuit 42 is connected between node 40 and the input to S/H stage 14. If the voltage at input node 12 is equal to $V_{in1}$ during a first portion of the row time and is equal to $V_{in2}$ during a second portion of the row time, the analog CDS stage is arranged such that:

the clamp switch is closed during the first portion of the row time and the voltage at the CDS input is equal to a voltage $V_{in1}$;

the clamp switch is open during the second portion of the row time and the voltage at the CDS input is equal to a voltage $V_{in2}$;

the reset level $V_{rst}$ is substantially equal to fixed voltage $V_{clamp,cds}$; and the signal amplitude $\Delta V_{sig}$ is substantially equal to ($V_{in1} - V_{in2}$).

If $V_{in}$ is a pixel output having an associated pixel reset level and pixel signal level, the pixel reset level being the pixel output with no integrated photocurrent and the pixel signal level being the pixel output with integrated photocurrent, then the voltage $V_{in1}$ is equal to the pixel reset level, and the voltage $V_{in2}$ is equal to the pixel signal level. In the presence of the analog CDS stage 38 as shown in FIG. 2, the DGSS ADC converts the CDS stage reset level (substantially equal to $V_{clamp,cds}$) and the CDS stage signal level (substantially equal to $V_{clamp,cds} - \Delta V_{sig}$). If the analog CDS stage 38 is omitted, then the DGSS ADC converts the pixel reset level and the pixel signal level. In the following description "reset level" and "signal level" refer to either the CDS stage reset/signal level (in the presence of CDS stage) or the pixel signal/reset level (if the CDS stage is omitted).

The exemplary implementation of S/H stage 14 shown in FIG. 2 allows input sampling and analog-to-digital (A/D) conversion to be carried out in parallel. Furthermore, it has the useful property that it reorders the input samples; i.e. it allows the ADC to convert the signal level before the reset level even though the latter is sampled before the former. The CDS stage 14 comprises three sampling capacitors: two for reset sampling ($C_{r0}$ and $C_{r1}$) and one for signal sampling ($C_s$). A first reset capacitor $C_{r0}$ connected between a first reset node 44 and a constant potential, suitably ground, a first reset sampling switch operated with a control signal smp_r0 connected between the stage's input node 46 and first reset node 44, and a first reset select switch operated with a control signal con_r0 connected between first reset node 44 and S/H output 16. The stage further comprises a second reset capacitor $C_{r1}$ connected between a second reset node 48 and the constant potential, a second reset sampling switch operated with a control signal smp_r1 connected between input node 46 and second reset node 48, and a second reset select switch operated with a control signal con_r1 connected between the second reset node and S/H output 16. A signal capacitor $C_s$ is connected between a signal node 50 and the constant potential, a signal sampling switch operated with a control signal smp_s is connected between input node 46 and signal node 50, and a signal select switch operated with a control signal con_s is connected between the signal node and S/H output 16.

A switch operated with a control signal clr is connected between S/H output 16 and the constant potential. This switch is closed momentarily to clear the charge at S/H output 16 from the previous conversion before any of the three capacitors $C_s$, $C_{r0}$ or $C_{r1}$ is connected to S/H output 16. A switch operated with a control signal clr_s may be connected between node 50 and the constant potential. This switch resets node 50 to the constant potential before the smp_s switch is closed, thereby discharging capacitor $C_s$ and helping CDS buffer circuit 42 settle if it is implemented as a source follower. For example, if $C_s$ is discharged to ground and the CDS buffer is an NMOS source follower, then the settling time will be shortened because an NMOS source follower can deliver more current than its quiescent bias current on a low-to-high transition. A similar improvement in settling time can be achieved if the CDS buffer circuit 42 is a PMOS source follower, but then node 50 must be reset to a high potential. Note that resetting of nodes 44 and 48 is not needed to speed up the CDS buffer settling when driving the reset level because the reset level is essentially the same from one row time to the next and capacitors $C_{r0}$ and $C_{r1}$ remain charged essentially to the same level.

In a preferred mode of operation, there are two ADC conversions per row time, with the pixel reset level sampled before the signal level. The ADC converts the signal level before the reset level. More specifically, first and second reset capacitors $C_{r0}$ and $C_{r1}$ are used in alternate row times such that, in a first row time:

during the first portion of the first row time, the reset level for the current row is sampled on first reset capacitor $C_{r0}$ while the signal level sampled in the previous row is converted; and during the second portion of the first row time, the signal level for the current row is sampled on signal capacitor $C_s$ while the reset level sampled in the previous row is converted. Then in a second row time:

during the first portion of the second row time, the reset level for the current row is sampled on the second reset capacitor $C_{r1}$ while the signal level sampled in the previous row is converted; and during the second portion of the second row time, the signal level for the current row is sampled on signal capacitor $C_s$ while the reset level sampled in the previous row is converted. This sequence of events and the pipelined operation of sampling and analog-to-digital conversion are illustrated in the table at the bottom of FIG. 2. Here R1 and S1 denote the reset level and the signal level, respectively, of sample 1. Similarly R2 and S2 denote the reset level and the signal level, respectively, of sample 2. The subscript after the reset level identifies which of the two reset capacitors ($C_{r0}$ or $C_{r1}$) the voltage level is sampled on. For example, $R1_{cr0}$ denotes that the resel level of sample 1 is sampled on capacitor $C_{r0}$. The signal level (S1, S2, etc.) is always sampled on capacitor $C_s$. It is evident that while R1 precedes S1 during sampling, S1 precedes R1 during A/D conversion; i.e. the order is reversed.

FIG. 2 also illustrates a possible implementation of multiplexer 36. Ramp signals $V_{ramp,HG}$, $V_{ramp,LG}$, and threshold voltage $V_{thresh}$ are provided to respective inputs, any one of which can be selected and conveyed to a node 52. Node 52 may be connected directly to the second input of comparator 18; a local ramp buffer circuit 54 might optionally be interposed between node 52 and comparator 18 to isolate the ramp from comparator kickback. In a preferred embodiment local ramp buffer 54 and CDS buffer 42 have an identical circuit implementation so that the buffer's input-output voltage nonlinearity is canceled. For example, local ramp buffer 54 and CDS buffer 42 may be implemented as identical source followers. During the coarse conversion phase of the signal conversion, multiplexer 36 is configured such that threshold voltage $V_{thresh}$ is routed to node 52. The value of single-bit hg_flag is established during the coarse conversion phase of the signal conversion depending on whether the signal at S/H output 16 $V_{in,comp}$ is greater than or less than $V_{thresh}$. During the fine conversion phase of the signal and reset conversion, multiplexer 36 is configured such that either $V_{ramp,HG}$ or $V_{ramp,LG}$ is routed to node 52 depending on the state of hg_flag.

FIG. 3a illustrates one possible implementation of multiplexer 36 and the generation of hg_flag and the comparator output signal called latch. FIG. 3B is a preferred timing diagram for the signals shown in FIG. 3A. As in FIG. 2, multiplexer 36 receives ramp signals $V_{ramp,HG}$, $V_{ramp,LG}$, and threshold voltage $V_{thresh}$ at respective inputs. During the coarse signal conversion phase signal coarse is high, and is low during the fine signal and reset conversion phases. This signal controls the operation of the multiplexer switches: while coarse is high the switches selecting $V_{ramp,HG}$ and $V_{ramp,LG}$ are open and the switch selecting $V_{thresh}$ is closed. The multiplexer output node 52 is preferably connected to local ramp buffer circuit 54, the output of which is provided to the second input of comparator 18. The first input of comparator 18 is the S/H output 16, the voltage at which is $V_{in,comp}$. The output 26 of the comparator is preferably provided to a D-latch 24, which is an implementation of the memory element in FIG. 1A. At the end of the coarse conversion phase signal txc is pulsed high, which stores the comparator value in D-latch 24. Thus the value of hg_flag is established during the coarse conversion phase depending on whether $V_{in,comp}$ is less than or greater than $V_{thresh}$. During the following fine signal and reset conversion phases signals txc and coarse remain low; the value of hg_flag is unchanged and either the switch selecting $V_{ramp,HG}$ (if hg_flag=1) or the switch selecting $V_{ramp,LG}$ (if hg_flag=0) is closed in multiplexer 36. The ADC also preferably includes a logic OR gate 62 whose inputs are the output 26 of the comparator and a signal set. The latter is pulsed high at the end of the count time during signal and reset fine conversion and forces the OR gate 62 output to also go high regardless of the comparator state. The set signal forces the ADC to latch the highest count value in case the comparator never trips because $V_{in,comp}$ is outside the range of $V_{ramp,LG}$. The OR gate's output is provided to an RS latch 64, whose role is to filter out any comparator chatter. Namely, the output of the RS-latch (the latch signal) goes high as soon as the OR gate's output goes high; once the latch signal goes high, it remains high until the RS-latch is cleared by means of the rstb signal. The latch signal is provided to the DGSS digital memory, which includes 11-bit signal fine data and 11-bit reset fine data. When the latch signal goes high during the signal or reset count time, the value of the 11-bit counter bus is latched and stored as the 11-bit signal or reset fine data.

Figure 4:
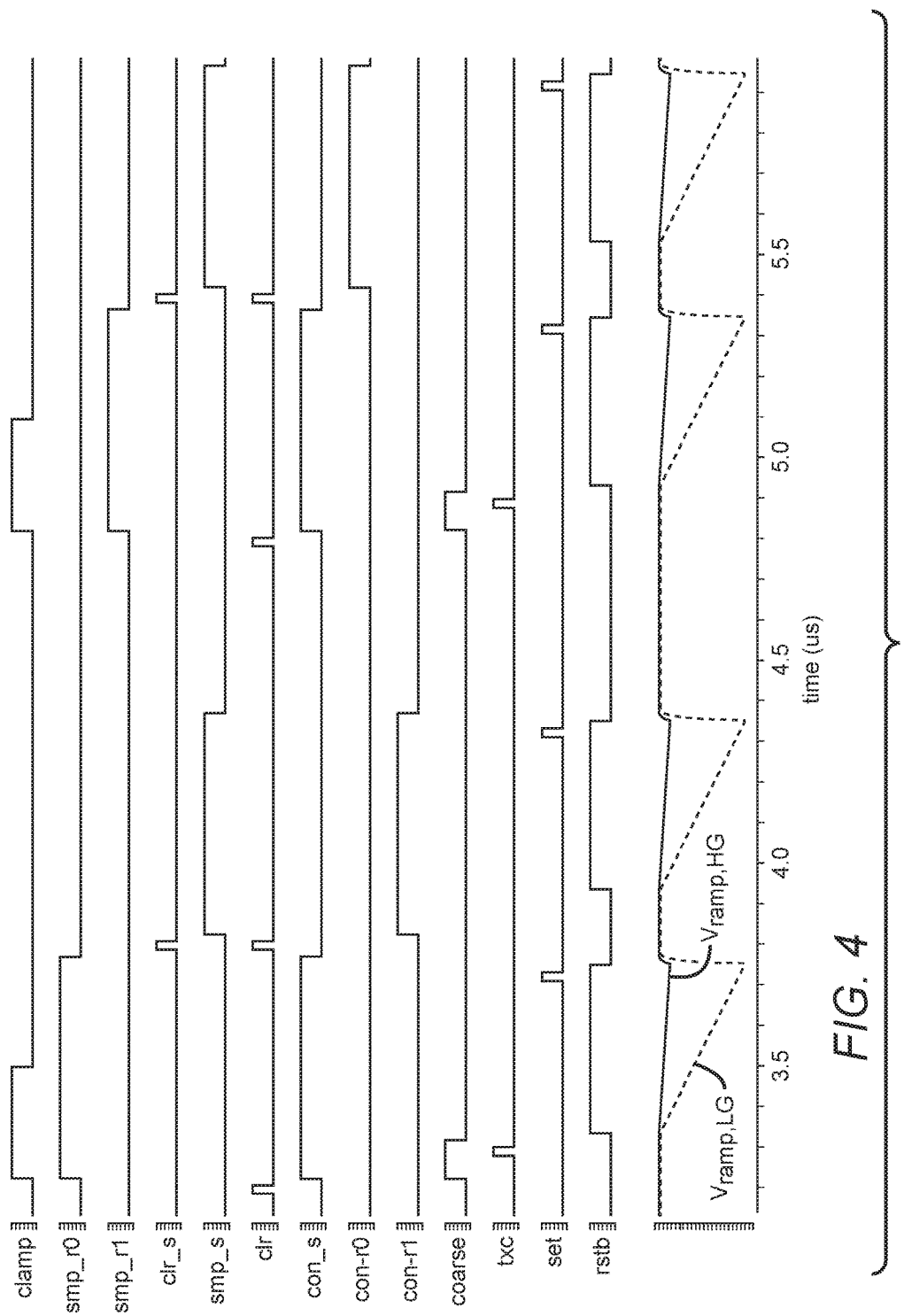
FIG. 4 is a timing diagram of the signals used in the DGSS ADC implementation shown in FIGS. 2 and 3A.

FIG. 4 is one possible timing diagram of the signals used in the DGSS ADC implementation shown in FIGS. 2 and 3A. The signal waveforms are plotted over two row times where each row time includes one signal conversion and one reset conversion.

Figure 5:
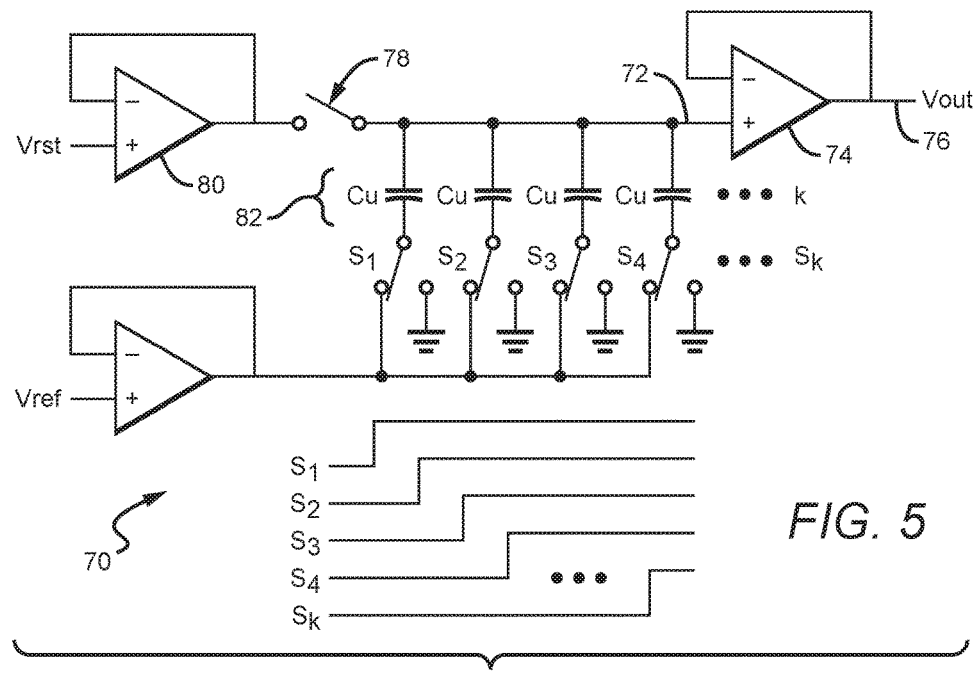
FIG. 5 is a schematic diagram illustrating the basic operating principles of a ramp generator as might be used with a DGSS ADC per the present invention.

FIG. 5 is a simplified schematic diagram illustrating the principle of operation of a HG or LG ramp generator as might be used with the present DGSS ADC. Such a ramp generator would typically be employed globally; i.e. it would be shared among multiple ADC columns. One of the key requirements of the ramp generator is to be monotonic, and hence a suitable solution is a capacitive digital-to-analog converter (CDAC) comprised of k unit capacitors $C_u$. As shown in FIG. 5, the top plates of all unit capacitors 82 are connected to a summing node 72, the voltage at which is $V_{sum}$. The bottom plate of each unit capacitor is switched (using respective switches controlled by signals $s_1$, $s_2$, $s_3$, $s_4$ to $s_k$) to either a first or a second reference level (here, a buffered reference voltage $V_{ref}$ and ground, respectively). A reset switch 78 is connected between summing node 72 and a reset voltage $V_{rst}$, preferably buffered with a buffer 80. The ramp generator 70 preferably includes a ramp buffer 74 which provides a buffered output $V_{ramp}$ at a buffered output node 76.

The following description applies to the generation of a descending ramp; for an ascending ramp, the ramp generator operation remains the same but the first and second reference levels need to be exchanged. It is assumed that the count time is divided into an integer number c clock cycles. The ramp generator circuit is arranged such that outside of the count time, reset switch 78 is closed and switches $s_1$-$s_k$ are operated such that the bottom plates of all k unit capacitors are switched to first reference level $V_{ref}$. Then during the count time, reset switch 78 is open, and on every clock cycle an integer number m unit capacitors are simultaneously switched from $V_{ref}$ to ground. Due to charge conservation at the summing node 72, this operation results in a voltage step on every clock cycle $$\Delta V_{sum} = -\frac{mC_u}{kC_u + C_0}V_{ref},$$

where $C_0$ is any additional capacitance at the summing node 78. If $kC_u \gg C_0$, the voltage step at the summing node 72 on every clock cycle is $$\Delta V_{sum} \cong -\frac{m}{k}V_{ref}.$$

At the end of the count time after c clock cycles have been completed the ramp swing is $$\Delta V_{ramp} = c\Delta V_{sum} \cong -\frac{c \cdot m}{k}V_{ref},$$

where c·m is the total number of unit capacitors (c·m≤k) whose bottom plates have been switched from $V_{ref}$ to ground. At the end of the count time the bottom plates of k-c·m unit capacitors remain connected to $V_{ref}$.

Figure 6:
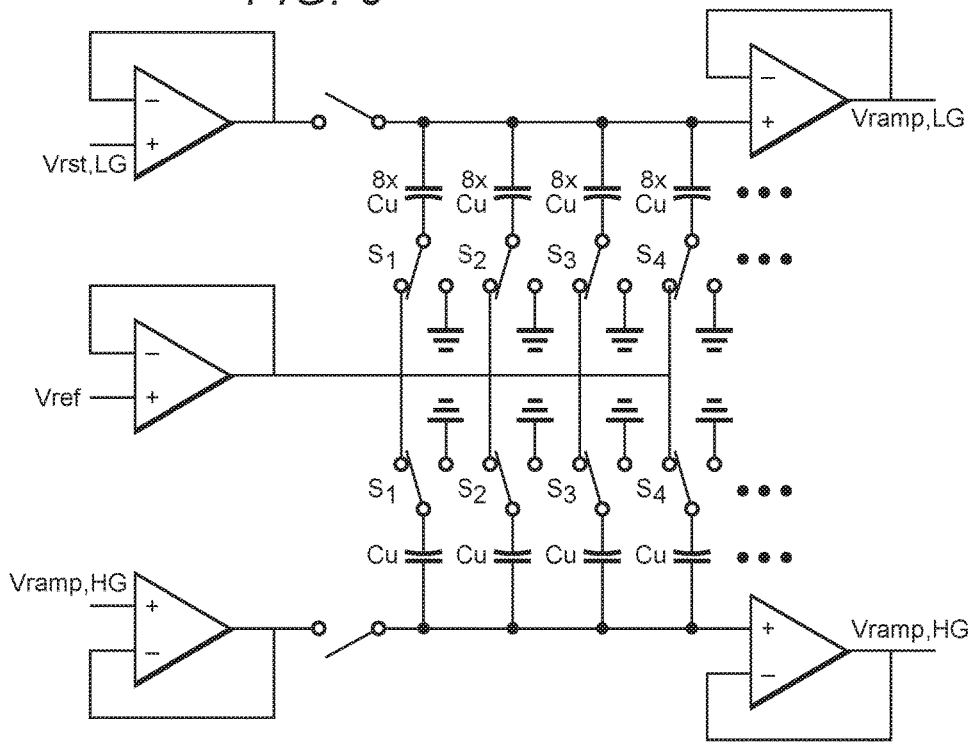
FIG. 6 is a schematic diagram illustrating one possible embodiment of the HG and LG ramp generators as might be used with a DGSS ADC per the present invention.

The CDAC switching frequency and the DGSS ADC counting frequency are normally related. The CDAC switching frequency is typically lower than the ADC counting frequency (for example 4× lower). This results in a CDAC voltage step $\Delta V_{sum}$ that is larger than the ADC quantization step (for example, 4× larger), but filtering due to limited ramp buffer bandwidth produces smooth $V_{ramp}(t)$ and minimum ADC differential non-linearity (DNL). If the DGSS ADC uses an n-bit counter, then the number c of CDAC steps during the count time is preferably given by $c=2^p$, where p is an integer and p≤n. For example, if n=11 and p=9, then during the count time the ADC counter will go through $2^{11}=2048$ counts while the CDAC will go through $2^9=512$ cycles. This example illustrates a CDAC switching frequency that is 4× lower than the ADC counting frequency. As shown in FIG. 6, the HG and LG ramps as required by the DGSS ADC may be generated by two identical CDAC instances each composed of the same number of unit capacitors. In order to ensure a well defined LG-to-HG ramp slope ratio, the buffered reference voltage $V_{ref}$ is preferably shared between the two CDACs. Each ramp may have the same or different reset voltage; in this example, different buffered reset voltages ($V_{rst,HG}$ and $V_{rst,LG}$, respectively) are used to define the start levels of the HG and LG ramps, respectively, for an extra degree of adjustability. If the LG-to-HG ramp slope ratio G is an integer, the total number of unit capacitors in each CDAC is k=G·c. For the CDAC generating the HG ramp, $m_{HG}=1$ (one unit capacitor is switched from $V_{ref}$ to ground on each clock cycle) and at the end of the count time the bottom plates of k/G unit capacitors are switched from $V_{ref}$ to ground. For the CDAC generating the LG ramp, $m_{LG}=G$ (G unit capacitors are switched from $V_{ref}$ to ground on each clock cycle) and at the end of the count time all k unit capacitors are switched from $V_{ref}$ to ground. In the example of FIG. 6, it is assumed that $m_{LG}=G=8$. The HG ramp swing over the count time is:

$$\Delta V_{ramp,HG} = c\Delta V_{sum,HG} = -\frac{c \cdot m_{HG}C_u}{kC_u + C_0}V_{ref} = -\frac{\frac{k}{G}C_u}{kC_u + C_0}V_{ref}.$$

The LG ramp swing over the count time is:

$$\Delta V_{ramp,LG} = c\Delta V_{sum,LG} = -\frac{c \cdot m_{LG}C_u}{kC_u + C_0}V_{ref} = -\frac{kC_u}{kC_u + C_0}V_{ref}.$$

The HG and LG ramp slopes are entirely dependent on capacitor ratio and are insensitive to process, supply voltage, and temperature (PVT) variation. As can be seen, the ratio of the LG ramp slope to the HG ramp slope:

$$\frac{\Delta V_{ramp,LG}}{\Delta V_{ramp,HG}} = G$$

and is independent of $C_u$, $C_0$ and $V_{ref}$.

As an example of a ramp generator as might be used with the present DGSS ADC: For LG ramp generation:
  the CDAC uses 4096 total unit capacitors (4096$C_u$)
  8 unit capacitors (8$C_u$) switched per clock cycle
  512 clock cycles ($T_c$)
  8×512=4096 total switched unit capacitors
When so arranged, $V_{ramp,LG}$ is given by:

$$V_{ramp,LG} = V_{rst} - \frac{t}{512T_c}V_{ref}$$

For HG ramp generation:
DAC uses 4096 total unit capacitors (4096$C_u$)
1 unit capacitor ($C_u$) switched per clock cycle
512 clock cycles ($T_c$)
512 total switched unit capacitors
When so arranged, $V_{ramp,HG}$ is given by:

$$V_{ramp,HG} = V_{rst} - \frac{t}{512T_c}\frac{V_{ref}}{8}$$

To summarize, the DGSS ADC described herein preferably uses two simultaneous global ramps of different slopes—a low-gain (LG) ramp spanning the full input range and a high-gain (HG) ramp spanning a fraction of the input range—preferably near the pixel dark level. If G is the ratio of the LG and HG ramp slopes, the resulting ADC quantization step when the HG ramp is selected is G-times smaller than when the LG ramp is selected. The ADC therefore has a variable quantization step depending on the input voltage. This approach effectively increases the ADC dynamic range by a factor of G while preserving the same conversion time. As a result, it is possible to design a DGSS ADC combining, for example, 14-bit dynamic range with the conversion speed of an 11-bit ADC. The HG and LG ramps are preferably generated by CDACs, with the HG ramp selected when digitizing input signals close to the pixel dark level, and the LG ramp selected when digitizing input signals away from the pixel dark level. The HG/LG ramp selection is performed during a coarse conversion phase. The sampled signal is compared against a threshold voltage positioned towards the end of the HG ramp swing. During the following fine conversion phase, the comparator is connected to either the HG ramp or the LG ramp. When the ramp becomes equal to the input, the comparator toggles and the current counter value is stored. A single comparator is used for selection between the HG and LG ramps during the coarse conversion phase, and for HG/LG conversion during the fine conversion phase. Using the same comparator for both HG and LG is preferred in order to achieve no discontinuity at the HG/LG switch point. The DGSS ADC may be used to implement digital CDS, in which case it performs two conversions (one of the signal level and one of the reset level) per row time. The same ramp (either HG or LG) is used for both signal and reset conversion. This cancels the comparator delay and all offsets in the analog chain after digital CDS.

Also note that the present DGSS ADC requires a small layout area and fits in a small column pitch, for example 2.8 µm. In addition, it does not require capacitor matching, is inherently monotonic, and has no column-to-column gain errors (if using a shared voltage ramp). The design eases the resolution-speed tradeoff and is ideal for image sensors that have a relatively small well capacity. With an 11-bit counter and an LG-to-HG ramp slope ratio of 8, the DGSS ADC can be arranged to behave as a 14-bit ADC in terms of quantization step near the pixel dark level, and an 11-bit ADC in terms of speed.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A column-parallel dual-gain single-slope analog-to-digital converter (ADC), said ADC comprising:
an input node for receiving an input signal $V_{in}$, said input signal $V_{in}$ having an associated maximum input swing $\Delta V_{in,max}$;
a sample-and-hold (S/H) stage having an input coupled to said input node and arranged to sample $V_{in}$ and provide sampled signal $V_{in,samp}$ at an S/H output;
a comparator having first and second inputs and an output;
a threshold voltage $V_{thresh}$;
a counter, which steps through a predefined range of count values in a count time;
a global ramp generator, that is common to multiple ADC columns and generates a high-gain (HG) ramp and a low-gain (LG) ramp, such that:
said HG and LG ramps ramp up or down simultaneously;
the ratio G of said LG ramp slope to said HG ramp slope is G>1;
the swing of said LG ramp during said count time is $\Delta V_{ramp,LG} \geq \Delta V_{in,max}$;
the swing of said HG ramp during said count time is $\Delta V_{ramp,HG} = \Delta V_{ramp,LG}/G$;
said ADC arranged such that:
during a sampling phase, input signal $V_{in}$ is sampled by said S/H stage and the sampled voltage $V_{in,samp}$ is provided to said comparator's first input;
during a coarse conversion phase, $V_{in,samp}$ is compared with $V_{thresh}$ and a flag hg_flag is set to either a first state or a second state depending on the comparison;
during a fine conversion phase, which follows said coarse conversion phase and includes said count time,
if said hg_flag is in said first state, said HG ramp is provided to said comparator's second input and said comparator output toggles when the HG ramp voltage becomes equal to $V_{in,samp}$, and
if said hg_flag is in said second state, said LG ramp is provided to said comparator's second input and said comparator output toggles when the LG ramp voltage becomes equal to $V_{in,samp}$.

2. The ADC of claim 1, wherein said sampling phase occurs simultaneously with said coarse and fine conversion phases.

3. The ADC of claim 1, further arranged such that:
said input signal $V_{in}$ varies between a constant reset level $V_{rst}$ and a signal level $V_{sig} = V_{rst} - \Delta V_{sig}$, where $\Delta V_{sig}$ is signal amplitude, which is either positive or negative depending on the application;
during said count time said LG ramp swings from $V_{ramp,LG,start}$ to $V_{ramp,LG,end} = V_{ramp,LG,start} - \Delta V_{ramp,LG}$, where $\Delta V_{ramp,LG}$ has the same polarity as $\Delta V_{sig}$, and $V_{rst}$ and $V_{sig}$ are between $V_{ramp,LG,start}$ and $V_{ramp,LG,end}$;
during said count time said HG ramp swings from $V_{ramp,HG,start}$ to $V_{ramp,HG,end} = V_{ramp,HG,start} - \Delta V_{ramp,HG}$, where $\Delta V_{ramp,HG}$ has the same polarity as $\Delta V_{sig}$, and $V_{rst}$ is between $V_{ramp,HG,start}$ and $V_{ramp,HG,end}$;
said threshold voltage $V_{thresh} = V_{ramp,HG,end} + \Delta V$, where $\Delta V$ has the same polarity as $\Delta V_{sig}$ and $0 < |\Delta V| < |\Delta V_{ramp,HG}|$;
if $\Delta V_{sig} > 0$, said hg_flag is in said first state if $V_{in,samp} > V_{thresh}$, and said hg_flag is in said second state if $V_{in,samp} \leq V_{thresh}$;
if $\Delta V_{sig} < 0$, said hg_flag is in said first state if $V_{in,samp} < V_{thresh}$, and said hg_flag is in said second state if $V_{in,samp} \geq V_{thresh}$.

4. The ADC of claim 3, wherein said input signal $V_{in}$ is equal to said reset level $V_{rst}$ during a first "reset read"

portion of a row time, and said input signal $V_{in}$ is equal to said signal level $V_{sig}$ during a second "signal read" portion of said row time.

5. The ADC of claim 4, said ADC operated to perform two conversions per row time and further arranged such that:
   the ADC digitizes said signal level $V_{sig}$ (signal conversion) and then said reset level $V_{rst}$ (reset conversion) in this order within said row time thereby performing digital correlated double sampling (CDS);
   said coarse conversion phase is present during said signal conversion and is not present during said reset conversion;
   the state of said hg_flag is established during said signal conversion and the same value is used during said reset conversion.

6. The ADC of claim 4, said ADC operated to perform one conversion per row time and further arranged such that:
   said reset read precedes said signal read;
   said sampling phase occurs during said signal read; and
   the ADC digitizes said signal level $V_{sig}$.

7. The ADC of claim 5, wherein said reset read precedes said signal read.

8. The ADC of claim 1, wherein:
   said counter is an n-bit counter,
   the ADC quantization step is $\Delta V_{ramp,LG}/2^n$ and the ADC resolution is n when hg_flag is in said second state,
   the ADC quantization step is $\Delta V_{ramp,LG}/(G \cdot 2^n)$ and the ADC resolution is $n+\log_2 G$ when said hg_flag is in said first state.

9. The ADC of claim 1, wherein G is a power of 2.

10. The ADC of claim 5, said ADC further arranged such that:
    said input signal $V_{in}$ is a pixel output having an associated pixel reset level and pixel signal level, said pixel reset level being the pixel output with no integrated photocurrent and said pixel signal level being the pixel output with integrated photocurrent;
    said reset level $V_{rst}$ is equal to said pixel reset level; and
    said signal level $V_{sig}$ is equal to said pixel signal level.

11. The ADC of claim 1, further comprising digital memory, said ADC arranged such that the value of said counter is latched and stored in said digital memory when said comparator output toggles during said fine conversion phase.

12. The ADC of claim 11, wherein said ADC is arranged to provide an output consisting of the counter value stored in said digital memory and the state of said hg_flag.

13. The ADC of claim 1, further comprising a multiplexer having at least three inputs and an output, said voltage $V_{thresh}$, said HG ramp, and said LG ramp provided to respective multiplexer inputs and said output coupled to said comparator's second input, said ADC arranged to operate said multiplexer such that $V_{thresh}$ is selected and thereby connected to said multiplexer output during said coarse conversion phase, said HG ramp is selected and thereby connected to said multiplexer output during said fine conversion phase if said hg_flag is in said first state, and said LG ramp is selected and thereby connected to said multiplexer output during said fine conversion phase if said hg_flag is in said second state.

14. The ADC of claim 13, wherein said multiplexer comprises a local ramp buffer interposed between its inputs and its output.

15. The ADC of claim 14, wherein said local ramp buffer is a source follower.

16. The ADC of claim 1, further comprising an analog CDS stage interposed between said ADC input node and the input to said S/H stage.

17. The ADC of claim 16, wherein said analog CDS stage comprises:
    a capacitor connected in series between said CDS input and a first node;
    a clamp switch connected between said first node and a fixed voltage $V_{clamp}$; and
    a buffer connected between said first node and said CDS output;
    said analog CDS stage further arranged such that:
      said clamp switch is closed during said reset read and the voltage at said CDS input is equal to a voltage $V_{in1}$,
      said clamp switch is open during said signal read and the voltage at said CDS input is equal to a voltage $V_{in2}$,
      said reset level $V_{rst}$ is substantially equal to said fixed voltage $V_{clamp}$, and
      said signal amplitude $\Delta V_{sig}$ is substantially equal to $(V_{in1}-V_{in2})$.

18. The ADC of claim 17, said ADC further arranged such that:
    said CDS input is a pixel output having an associated pixel reset level and pixel signal level, said pixel reset level being the pixel output with no integrated photocurrent and said pixel signal level being the pixel output with integrated photocurrent;
    said voltage $V_{in1}$ is equal to said pixel reset level; and
    said voltage $V_{in2}$ is equal to said pixel signal level.

19. The ADC of claim 17, wherein said buffer is a source follower.

20. The ADC of claim 7, wherein said S/H stage comprises:
    a first reset capacitor connected between a first reset node and a constant potential;
    a first reset sampling switch connected between said input node and said first reset node;
    a first reset select switch connected between said first reset node and said S/H output;
    a second reset capacitor connected between a second reset node and said constant potential;
    a second reset sampling switch connected between said input node and said second reset node;
    a second reset select switch connected between said second reset node and said S/H output;
    a signal capacitor connected between a signal node and said constant potential;
    a signal sampling switch connected between said input node and said signal node; and
    a signal select switch connected between said signal node and said S/H output.

21. The ADC of claim 20, wherein said first and second reset capacitors are used in alternate row times such that:
    in a first row time:
      during said reset read, the reset level for the current row is sampled on said first reset capacitor while the signal level sampled in the previous row is converted; and
      during said signal read, the signal level for the current row is sampled on said signal capacitor while the reset level sampled in the previous row is converted;

and in a second row time:
  during said reset read, the reset level for the current row is sampled on said second reset capacitor while the signal level sampled in the previous row is converted; and
  during said signal read, the signal level for the current row is sampled on said signal capacitor while the reset level sampled in the previous row is converted.

22. The ADC of claim 1, wherein said global ramp generator is comprised of a HG ramp generator circuit and a LG ramp generator circuit, each ramp generator circuit comprising:
  an output node;
  a buffered output node;
  a ramp buffer connected between said output node and said buffered output node;
  a reset switch connected between said output node and a reset voltage;
  an integer number k unit capacitors, the top plate of each capacitor connected to said output node, and the bottom plate of each capacitor switched to either a first or a second reference level.

23. The ramp generator circuit of claim 22, further arranged such that:
  outside of said count time, said reset switch is closed and the bottom plates of said k unit capacitors are switched to said first reference level;
  during said count time said reset switch is open;
  said count time is divided into an integer number c clock cycles such that during each clock cycle an integer number m (1<m<k) unit capacitors are simultaneously switched from said first reference level to said second reference level; and
  at the end of said count time, the bottom plates of c·m (c·m≤k) unit capacitors are switched to said second reference level, and k−c·m unit capacitors are still switched to said first reference level.

24. The ramp generator circuit of claim 23, wherein said counter is an n-bit counter, and c=$2^p$, where p is an integer and p≤n.

25. The ramp generator circuit of claim 23, further arranged such that:
  G is an integer;
  total unit capacitors k=G·c;
  for said HG ramp, m=1 and at the end of said count time the bottom plates of k/G unit capacitors are switched from said first reference level to said second reference level;
  for said LG ramp, m=G and at the end of said count time k unit capacitors are switched from said first reference level to said second reference level.

26. A method of performing an analog-to-digital conversion, comprising:
  providing a high gain (HG) ramp;
  providing a low gain (LG) ramp, the slope of said LG ramp being greater than that of said HG ramp;
  providing a threshold voltage $V_{thresh}$;
  during a sampling phase, sampling an input signal $V_{in}$, said sampled input signal being $V_{in,samp}$;
  during a coarse conversion phase:
    comparing $V_{in,samp}$ to $V_{thresh}$ and setting a flag hg_flag to either a first state or a second state depending on the comparison; and
  during a fine conversion phase which follows said coarse conversion phase:
    if hg_flag is in said first state:
      comparing said HG ramp to $V_{in,samp}$; and
      toggling an output flag when the HG ramp voltage becomes equal to $V_{in,samp}$; and
    if hg_flag is in said second state:
      comparing said LG ramp to $V_{in,samp}$; and
      toggling said output flag when the LG ramp voltage becomes equal to $V_{in,samp}$.

27. The method of claim 26, further comprising:
  providing a counting means which steps through a predefined range of count values in a count time;
  triggering said counting means to begin counting at the beginning of said fine conversion phase; and
  storing the present count when said output flag toggles.

28. The method of claim 27, wherein said analog-to-digital conversion operates over an associated input swing, the swing of said LG ramp covering said input swing in said count time.

29. The method of claim 28, wherein the slope of said LG ramp is G times that of said HG ramp, such that the swing of said HG ramp covers 1/G of said input swing in said count time.

30. The method of claim 27, further arranged such that:
  said input signal $V_{in}$ varies between a constant reset level $V_{rst}$ and a signal level $V_{sig}=V_{rst}-\Delta V_{sig}$, where $\Delta V_{sig}$ is signal amplitude, which is either positive or negative depending on the application;
  during said count time, said LG ramp swings from $V_{ramp,LG,start}$ to $V_{ramp,LG,end}=V_{ramp,LG,start}-\Delta V_{ramp,LG}$, where $\Delta V_{ramp,LG}$ has the same polarity as $\Delta V_{sig}$, and $V_{rst}$ and $V_{sig}$ are between $V_{ramp,LG,start}$ and $V_{ramp,LG,end}$;
  during said count time, said HG ramp swings from $V_{ramp,HG,start}$ to $V_{ramp,HG,end}=V_{ramp,HG,start}-\Delta V_{ramp,HG}$, where $\Delta V_{ramp,HG}$ has the same polarity as $\Delta V_{sig}$, and $V_{rst}$ is between $V_{ramp,HG,start}$ and $V_{ramp,HG,end}$;
  said threshold voltage $V_{thresh}=V_{ramp,HG,end}+\Delta V$, where $\Delta V$ has the same polarity as $\Delta V_{sig}$ and $0<|\Delta V|<|\Delta V_{ramp,HG}|$;
  if $\Delta V_{sig}>0$, said hg_flag is in said first state if $V_{in,samp}>V_{thresh}$, and said hg_flag is in said second state if $V_{in,samp}\leq V_{thresh}$; and
  if $\Delta V_{sig}<0$, said hg_flag is in said first state if $V_{in,samp}<V_{thresh}$, and said hg_flag is in said second state if $V_{in,samp}\geq V_{thresh}$.

31. The method of claim 30, wherein said input signal $V_{in}$ is equal to said reset level $V_{rst}$ during a first "reset read" portion of a row time and said input signal $V_{in}$ is equal to said signal level $V_{sig}$ during a second "signal read" portion of said row time, said analog-to-digital conversion performing two conversions per row time and further comprising:
  digitizing said signal level $V_{sig}$ (signal conversion) and then said reset level $V_{rst}$ (reset conversion) in this order within said row time thereby performing digital correlated double sampling (CDS);
  wherein said coarse conversion phase is present during said signal conversion and is not present during said reset conversion; and
  the state of said hg_flag is established during said signal conversion and the same state is used during said reset conversion.

32. The method of claim 27, wherein:
said counting means is an n-bit counter,
the analog-to-digital quantization step is $\Delta V_{ramp,LG}/2^n$ and the analog-to-digital conversion resolution is n when said hg_flag is in said second state,
the analog-to-digital quantization step is $\Delta V_{ramp,LG}/(G \cdot 2^n)$ and the analog-to-digital conversion resolution is $n+\log_2 G$ when said hg_flag is in said first state.

33. The method of claim 26, wherein G is a power of 2.

* * * * *